United States Patent [19]
Ojima et al.

[11] Patent Number: 5,608,343
[45] Date of Patent: Mar. 4, 1997

[54] CIRCUIT FOR VARYING READ TIMING

[75] Inventors: Hisayuki Ojima, Kawasaki; Hiroshi Kuwahara, Oyama, both of Japan

[73] Assignee: Fujitsu Limited, Kanagawa, Japan

[21] Appl. No.: 429,820

[22] Filed: Apr. 27, 1995

[30] Foreign Application Priority Data

Jul. 18, 1994 [JP] Japan .................................. 6-165318

[51] Int. Cl.⁶ .................................................. H03K 17/28
[52] U.S. Cl. .............................. 326/93; 322/166; 322/252
[58] Field of Search ...................... 326/93; 327/161–162, 327/166, 250, 252, 277, 278

[56] References Cited

U.S. PATENT DOCUMENTS 3,764,920  10/1973  Galcik et al. ...................... 326/93 X
4,585,952   4/1986  Yamamoto ............................. 327/166
4,588,905   5/1986  Kojima ................................ 327/162 X
4,746,819   5/1988  Kashiwagi ......................... 327/250 X
4,929,849   5/1990  Paul ................................... 327/162 X

FOREIGN PATENT DOCUMENTS 3-101432  4/1991  Japan .

Primary Examiner—David R. Hudspeth

[57] ABSTRACT

A circuit changes the timing for reading data by varying bias potential applied to a clock signal used to read the data. The circuit has a comparator for comparing an external clock signal with a reference voltage that provides a logic decision level and generating an internal clock signal, and a logic circuit for fetching input data in synchronization with the internal clock signal. The comparator has a bias changer. The bias changer applies DC bias potential to the external clock signal to the comparator, to change the phase of the internal clock signal.

14 Claims, 15 Drawing Sheets

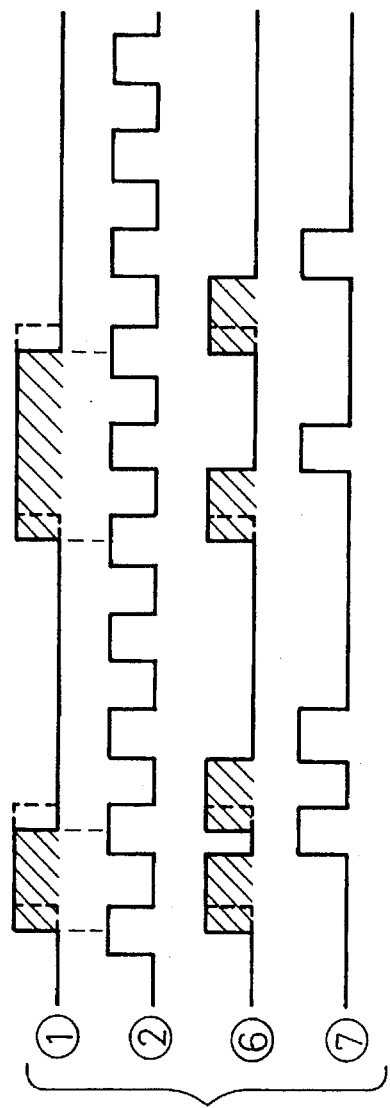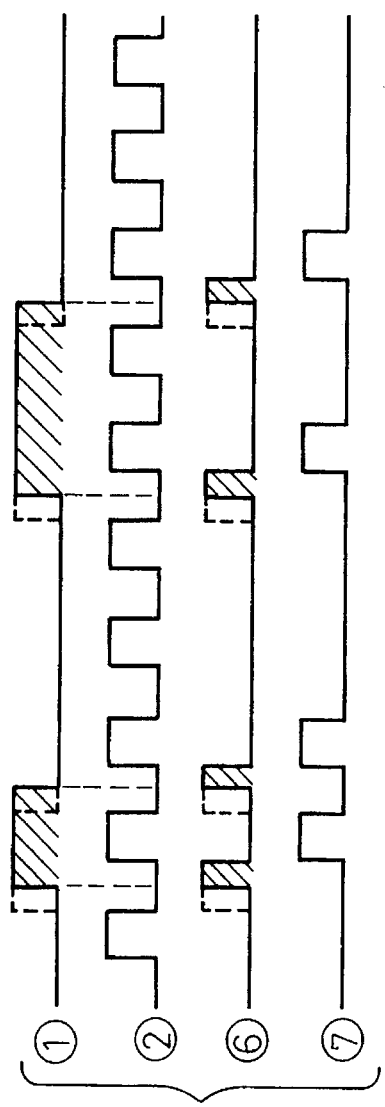

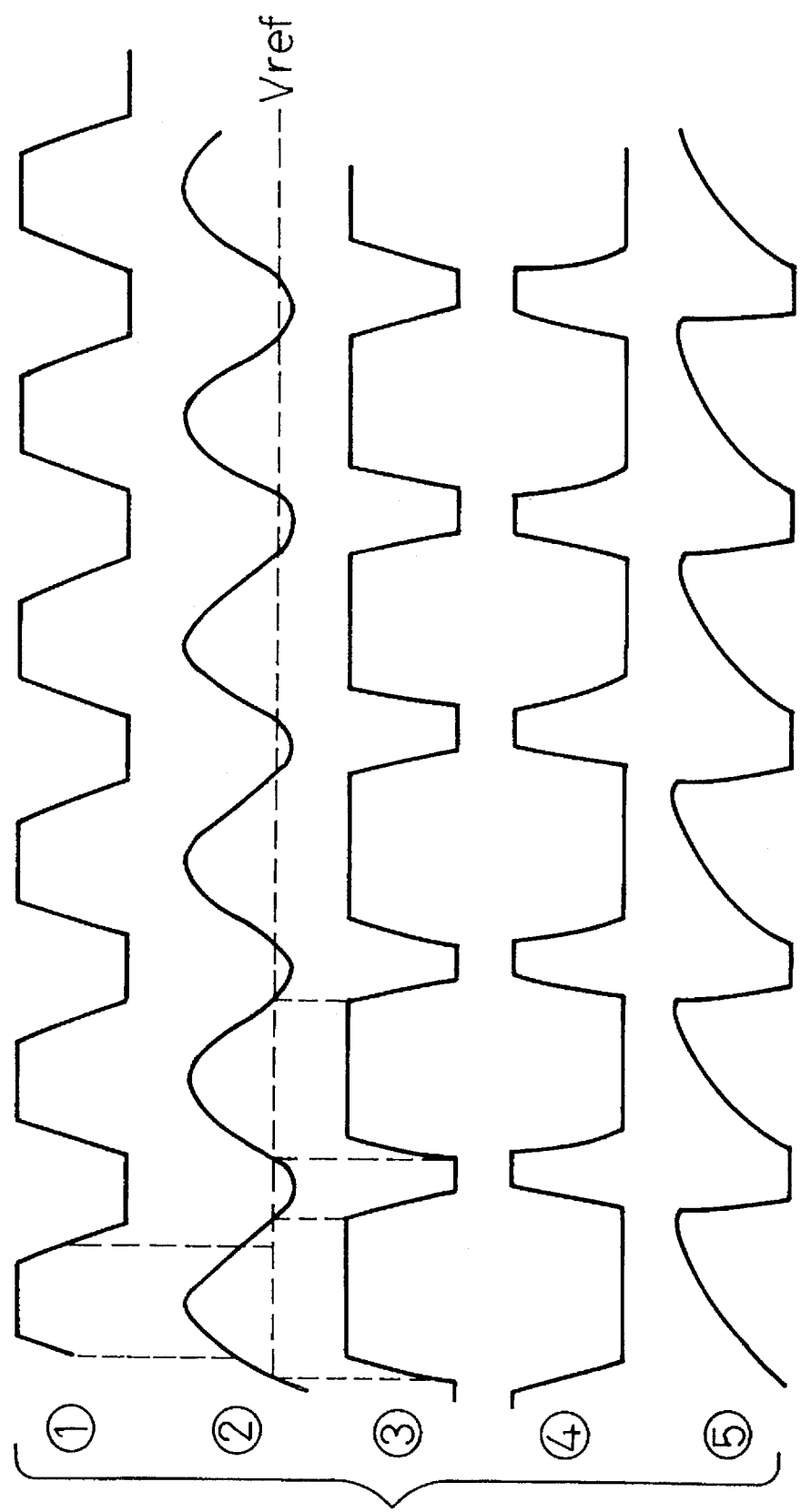

5,608,343

CIRCUIT FOR VARYING READ TIMING

BACKGROUND OF THE INVENTION

1. Field of the Invention

The present invention relates to a circuit for reading data, and particularly, to a circuit for varying read timing by changing the phase of a clock signal, to correctly read data in synchronization with the phase-changed clock signal.

2. Description of the Related Art

A data signal can be successfully read if its stable zone can be accessed. It is necessary, therefore, to synchronize a rising or falling edge of a clock signal with the stable zone of the data signal. If the edge of the clock signal is adjusted to the rising or falling of the data signal, an indefinite zone of the data signal will be read and this will cause read errors.

The relationship between a clock signal and a data signal is influenced by a phase shift in the clock signal, the structure of the clock generator, manufacturing variations, temperatures, etc. These factors may cause a clock signal to coincide with an indefinite zone of a data signal and result in read errors.

To avoid this problem, delay lines and phase shifters are usually employed to adjust the relationship between a data signal and a clock signal during manufacture. The delay lines and phase shifters, however, are expensive and involve complicated circuits and installation work.

SUMMARY OF THE INVENTION

An object of the present invention is to provide a simple and inexpensive circuit for varying read timing.

Another object of the present invention is to provide a delay circuit employing the circuit for varying read timing.

In order to accomplish the objects, a circuit for varying read timing according to the present invention has a comparator for comparing an external clock signal with a reference voltage that provides a logic decision level and generating an internal clock signal, and a logic circuit for fetching input data in synchronization with the internal clock signal. The comparator has a bias changer, which varies the DC bias potential applied to the external clock signal passed to the comparator, to thereby change the phase of the internal clock signal.

The present invention also provides a circuit for varying read timing, having a comparator for comparing an external clock signal with a reference voltage that provides a logic decision level and generating an internal clock signal, and a logic circuit for fetching input data in synchronization with the internal clock signal. The comparator has a reference voltage changer, which changes the reference voltage to the comparator, to thereby change the phase of the internal clock signal.

The bias changer may be a phase compensator for detecting a phase difference between the input data and the external clock signal and changing the DC bias potential applied to the external clock signal accordingly. The reference voltage changer may be a phase compensator for detecting a phase difference between the input data and the external clock signal and changing the reference voltage accordingly. The comparator may have a waveform converter for converting the waveform of the external clock signal to the comparator into a required waveform.

The waveform converter may be a sawtooth-wave generator or a band-pass filter. The logic circuit may be a flip-flop circuit that temporarily stores input data in synchronization with the internal clock signal.

The present invention also provides a delay circuit having a bias generator for applying DC bias potential, which corresponds to a delay between an input data signal and an output data signal, to the input data signal, and a comparator for comparing the biased data signal with a reference voltage that provides a logic decision level and providing a data signal.

The present invention also provides a delay circuit having a reference voltage generator for generating a reference voltage corresponding to a delay between an input data signal and an output data signal, and a comparator for comparing the input data signal with the reference voltage and providing a data signal.

The comparator may have a waveform converter for converting the waveform of the input data signal to the comparator into a required waveform.

The waveform converter may be a sawtooth-wave generator or a band-pass filter.

BRIEF DESCRIPTION OF THE DRAWINGS

The present invention will be more clearly understood from the description as set forth below with reference to the accompanying drawings in which:

FIGS. 12(A) and 12(B) explain the operation of the circuit of FIG. 10;

FIG. 15 explains the operation of the circuit of FIG. 14;

DESCRIPTION OF THE PREFERRED EMBODIMENTS

Figure 1:
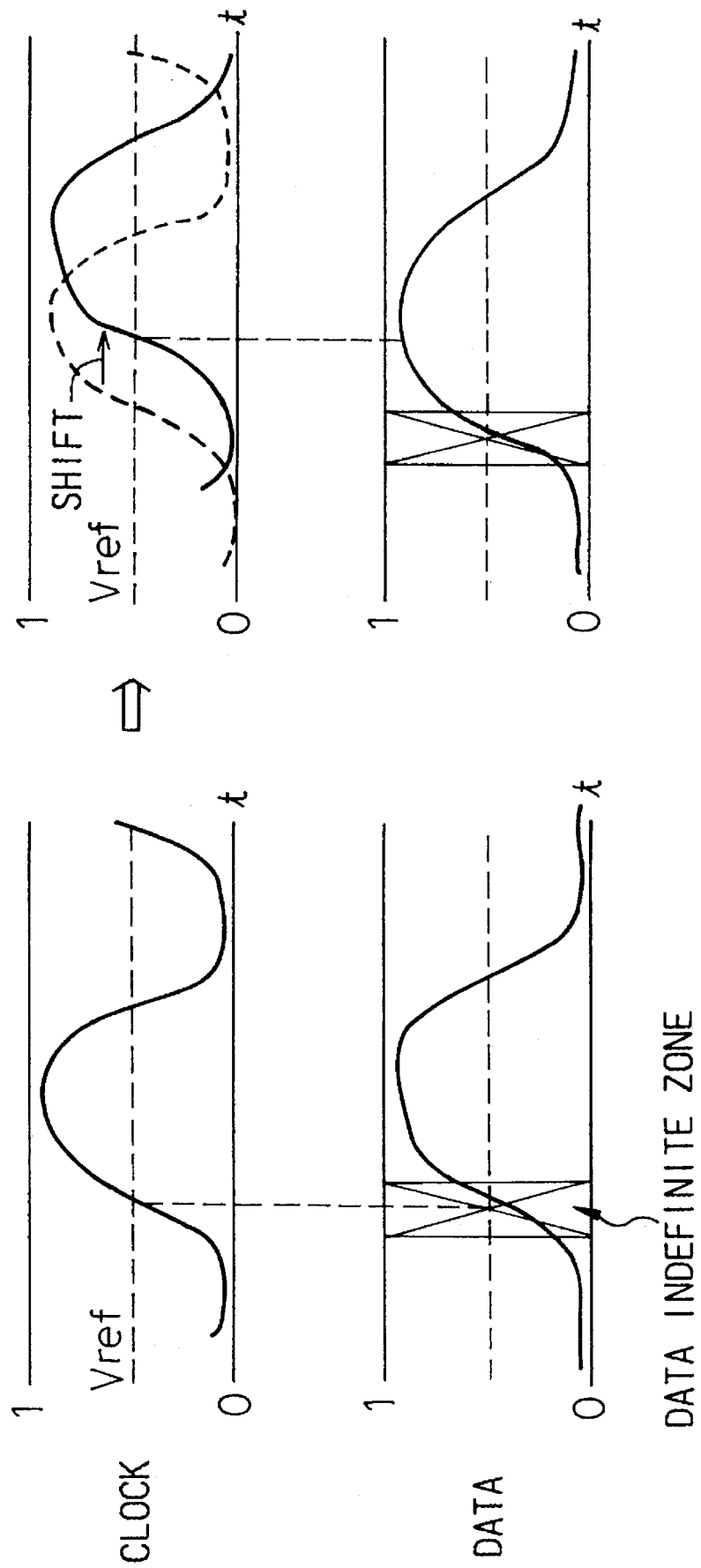
FIG. 1 shows a data signal and a clock signal for reading the data signal.

FIG. 1 shows a data signal and a clock signal for reading the data signal.

The left part of the figure shows that a rising edge of the clock signal exists near a rising edge of the data signal. The right part of the figure shows that the clock signal is delayed to sample a stable zone of the data signal.

In the left part, the clock signal samples an indefinite zone of the data signal, and a read errors occur. In the right part, the clock signal correctly samples the data signal, to cause no error. To realize the relationship, shown in the right part of FIG. 1, between the data signal and the clock signal, prior arts usually carry out adjustments during the manufacturing stage.

Figure 2A:
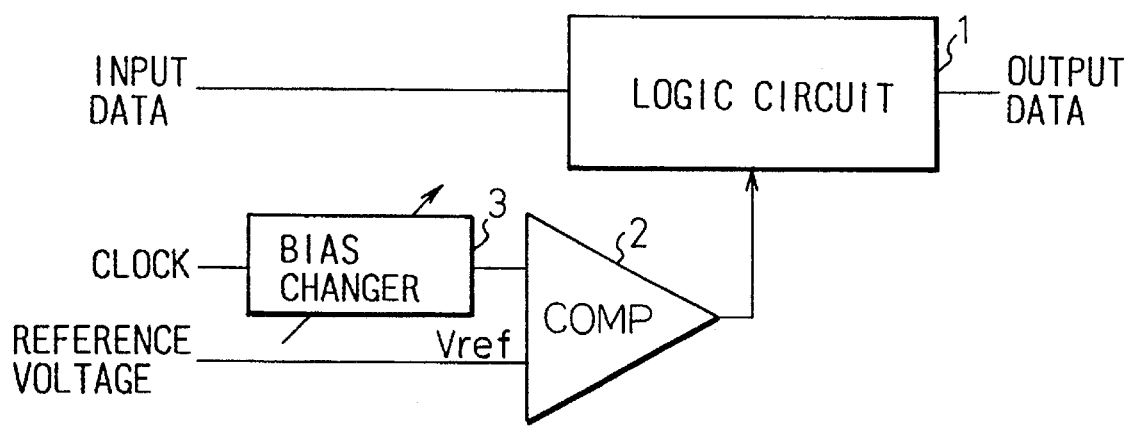
FIG. 2(A) shows a basic form of a circuit for varying read timing according to the present invention.

FIG. 2(A) shows a principle of a circuit for varying the read timing according to the present invention.

A comparator 2 compares an external clock signal with a reference voltage that provides a logic decision level, and generates an internal clock signal. A logic circuit 1 fetches input data in synchronization with the internal clock signal. The comparator 2 has a bias changer 3, which varies the DC bias potential applied to the external clock signal pussed to the comparator 2, to adjust the phase of the internal clock signal.

Figure 2B:
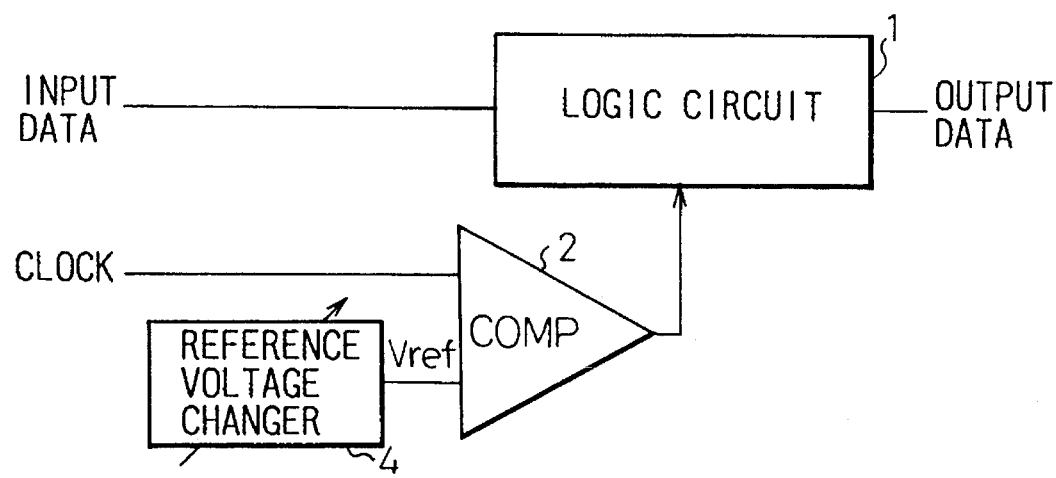
FIG. 2(B) shows another basic form of the circuit for varying read timing according to the present invention.

FIG. 2(B) shows a principle of another circuit for varying the read timing according to the present invention.

A comparator 2 compares an external clock signal with a reference voltage that provides a logic decision level, and generates an internal clock signal. A logic circuit 1 fetches input data in synchronization with the internal clock signal. The comparator 2 has a reference voltage changer 4, which varies the reference voltage to the comparator 2, to adjust the phase of the internal clock signal.

Figure 3A:
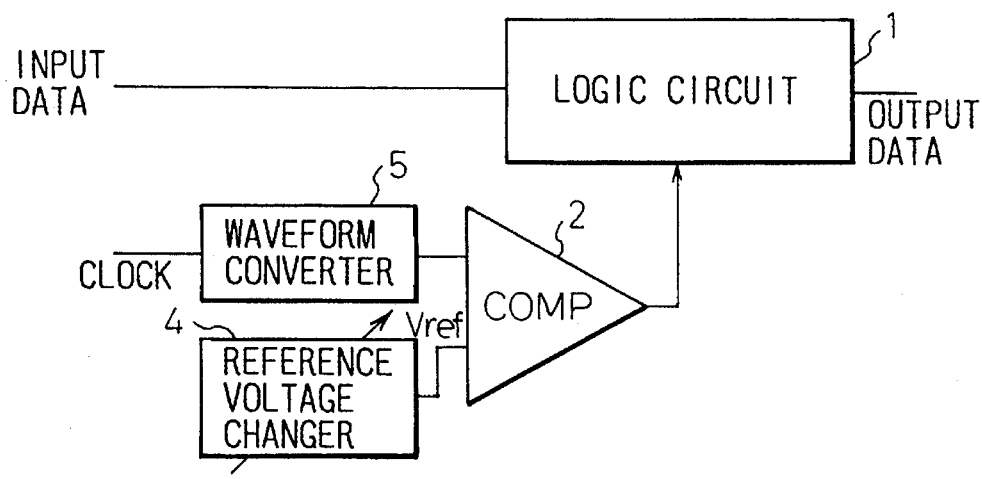
FIG. 3(A) shows an example (1) of the circuit for varying read timing according to the present invention.
Figure 3B:
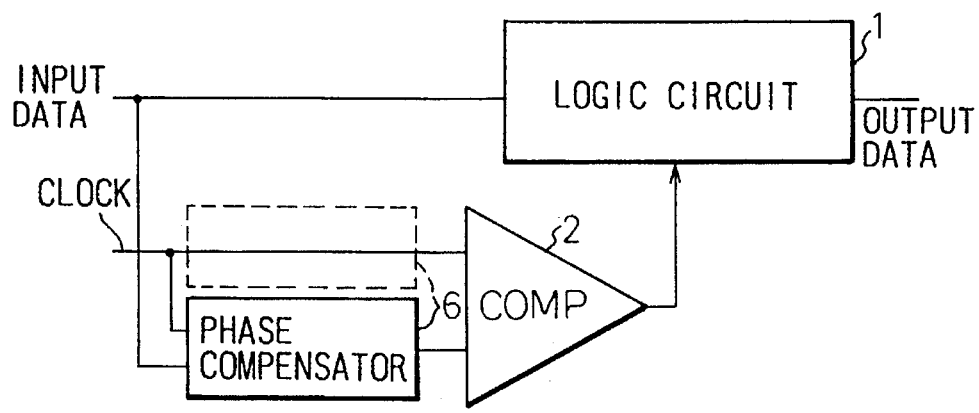
FIG. 3(B) shows an example (2) of the circuit for varying read timing according to the present invention.
Figure 3C:
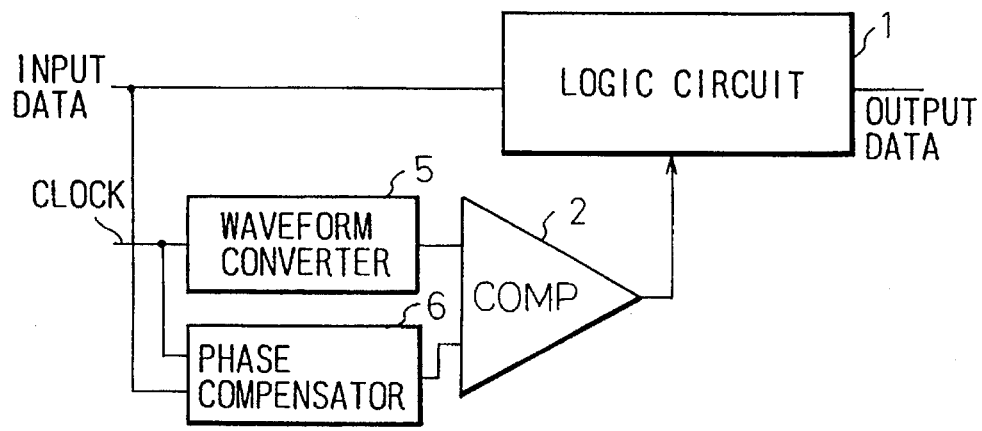
FIG. 3(C) shows an example (3) of the circuit for varying read timing according to the present invention.

FIGS. 3(A) to 3(C) show various forms of the circuit for varying the read timing according to the present invention.

A phase compensator 6 of FIGS. 3(B) and 3(C) serves as the bias changer 3 or reference voltage changer 4. The phase compensator 6 detects a phase difference between an input data signal and an external clock signal and varies the DC bias potential, applied to a corresponding signal, accordingly. The comparator 2 may have a waveform converter 5 of FIGS. 3(A) and 3(C). The waveform converter 5 converts the waveform of an external clock signal to the comparator 2 into a required waveform. The waveform converter 5 may be a sawtooth-wave generator or a band-pass filter. The logic circuit 1 may be a flip-flop circuit for temporarily storing input data in synchronization with an internal clock signal.

Based on the circuit for varying read timing, the present invention provides a data delay circuit. The data delay circuit has a bias generator for applying the DC bias potential, which corresponds to a delay between an input data signal and an output data signal, to the input data signal, and a comparator for comparing the biased data signal with a reference voltage that provides a logic decision level and providing a data signal.

The data delay circuit may have a reference voltage generator for generating a reference voltage corresponding to a delay between an input data signal and output data signal, and a comparator for comparing the reference voltage with the input data signal and providing a data signal.

The comparator may have a waveform converter. The waveform converter converts the waveform of an input data signal to the comparator into a required waveform. The waveform converter may be a sawtooth-wave generator or a band-pass filter.

Figure 4:
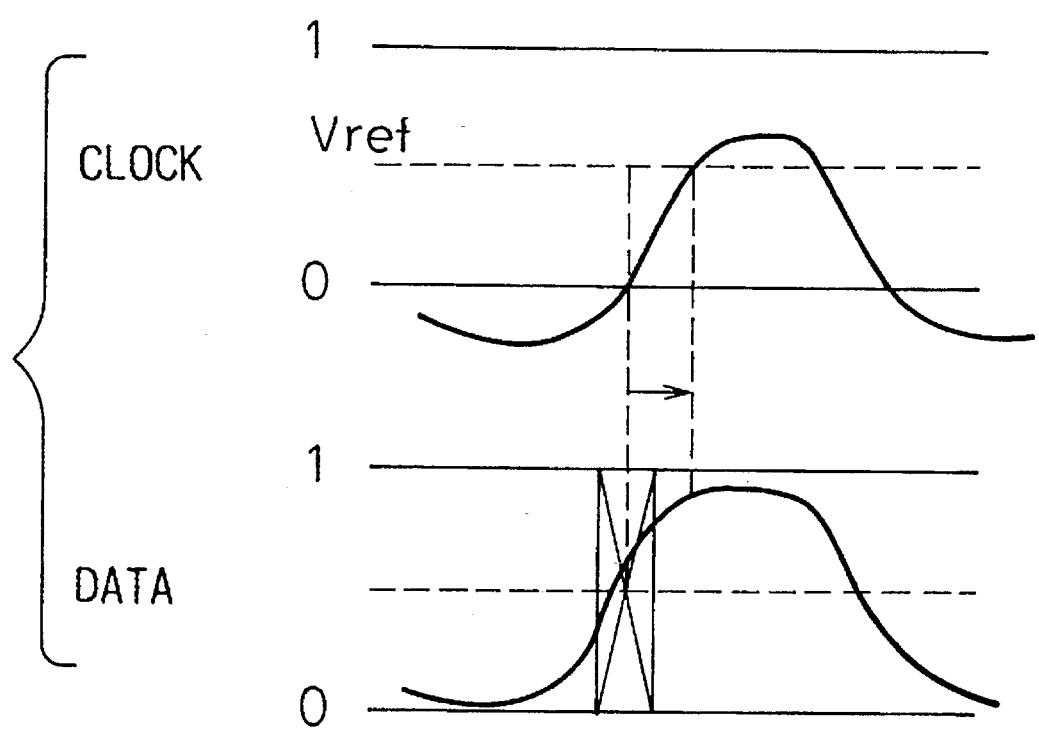
FIG. 4 explains a principle of varying read timing according to the present invention.

FIG. 4 explains a principle of varying the read timing according to the present invention. Instead of delaying a clock signal, the present invention changes the time when the clock signal crosses a reference voltage (threshold), to thereby change the time of sampling a data signal.

If the rising edge of a clock signal is in an indefinite zone of a data signal, the present invention varies the DC bias potential applied to the clock signal. In FIG. 4, the present invention applies a negative potential to the clock signal, to substantially delay the clock signal. The same effect is achievable by varying a reference voltage Vref for determining a logic value of the clock signal.

Figure 5:
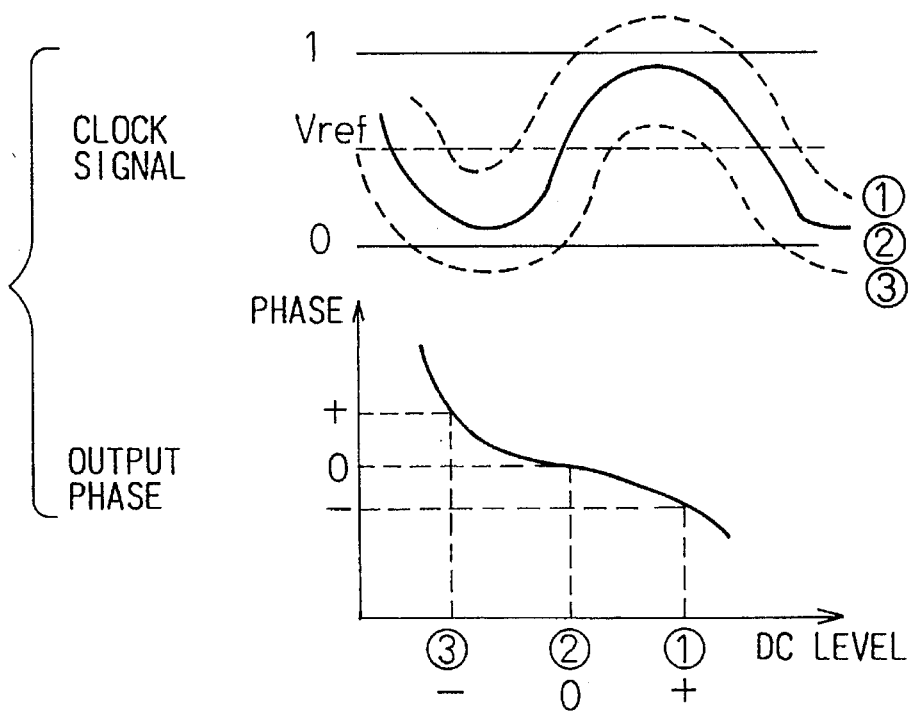
FIG. 5 explains the operation of the circuit of FIG. 2(A)

FIG. 5 explains the operation of the circuit of FIG. 2(A).

A continuous line ② in FIG. 5 represents an external clock signal. The bias changer 3 biases the external clock signal within the range between dotted lines ① and ③. The comparator 2 receives the biased clock signal and a fixed reference voltage Vref. Due to the bias changer 3, the timing of the external clock signal of crossing the reference voltage Vref shifts vertically, to change the phase of the output of the comparator 2. The lower part of FIG. 5 shows changes in the phase of the output of the comparator 2. As the DC level applied to the external clock signal increases, the timing of sampling an input data signal advances, and as it decreases, the sampling timing delays. This circuit is achievable with a simple structure because it only changes DC potential applied to an external clock signal.

Figure 6:
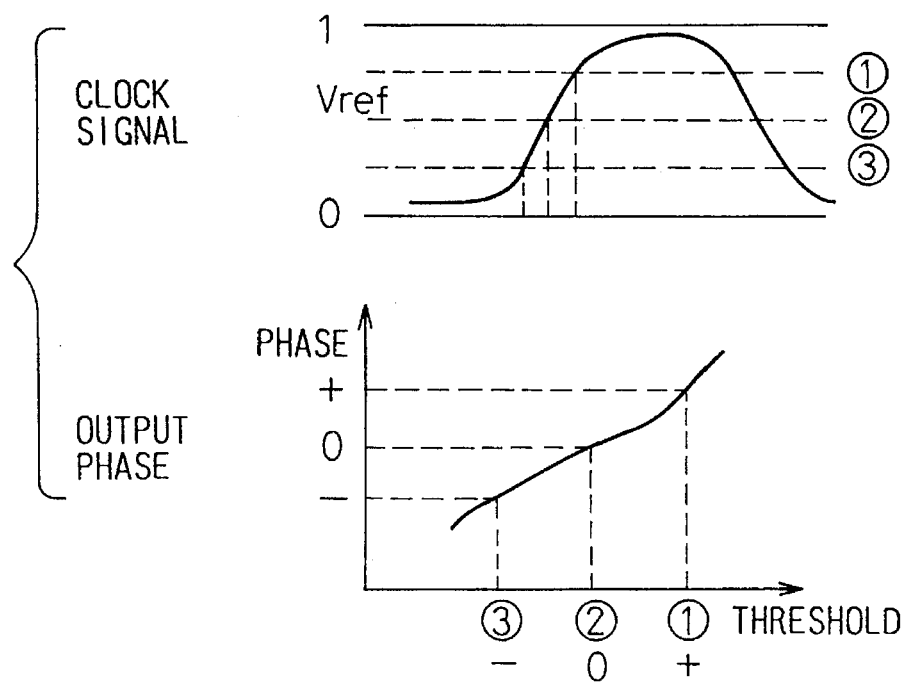
FIG. 6 explains the operation of the circuit of FIG. 2(B)

FIG. 6 explains the operation of the circuit of FIG. 2(B).

This circuit vertically shifts a reference voltage Vref ② in the range between dotted lines ① and ③. The level of an external clock signal is fixed. Vertically shifting the reference voltage Vref changes the time that the external clock signal crosses the reference voltage, to thereby change the phase of the output of the comparator 2. The lower part of FIG. 6 shows changes in the phase of the output of the comparator 2. As the reference voltage increases, the phase of the output of the comparator 2 delays, and as it decreases, the phase of the output advances. This circuit is achievable with a simple structure because it only changes a reference voltage.

The waveform converter 5 of FIGS. 3(A) and 3(C) converts the waveform of an input clock signal into a waveform having a long rise or fall time to expand a range of phase compensation. The waveform converter 5 may be a band-pass filter for converting the waveform of an input clock signal into a sine waveform, or a sawtooth-wave generator for converting the same into a triangle waveform.

The phase compensator 6 of FIGS. 3(B) and 3(C) detects a phase difference between an input data signal and a clock signal and carries out feed-forward control on a reference voltage, to automatically stabilize the phase of the output of the comparator 2.

Figure 7:
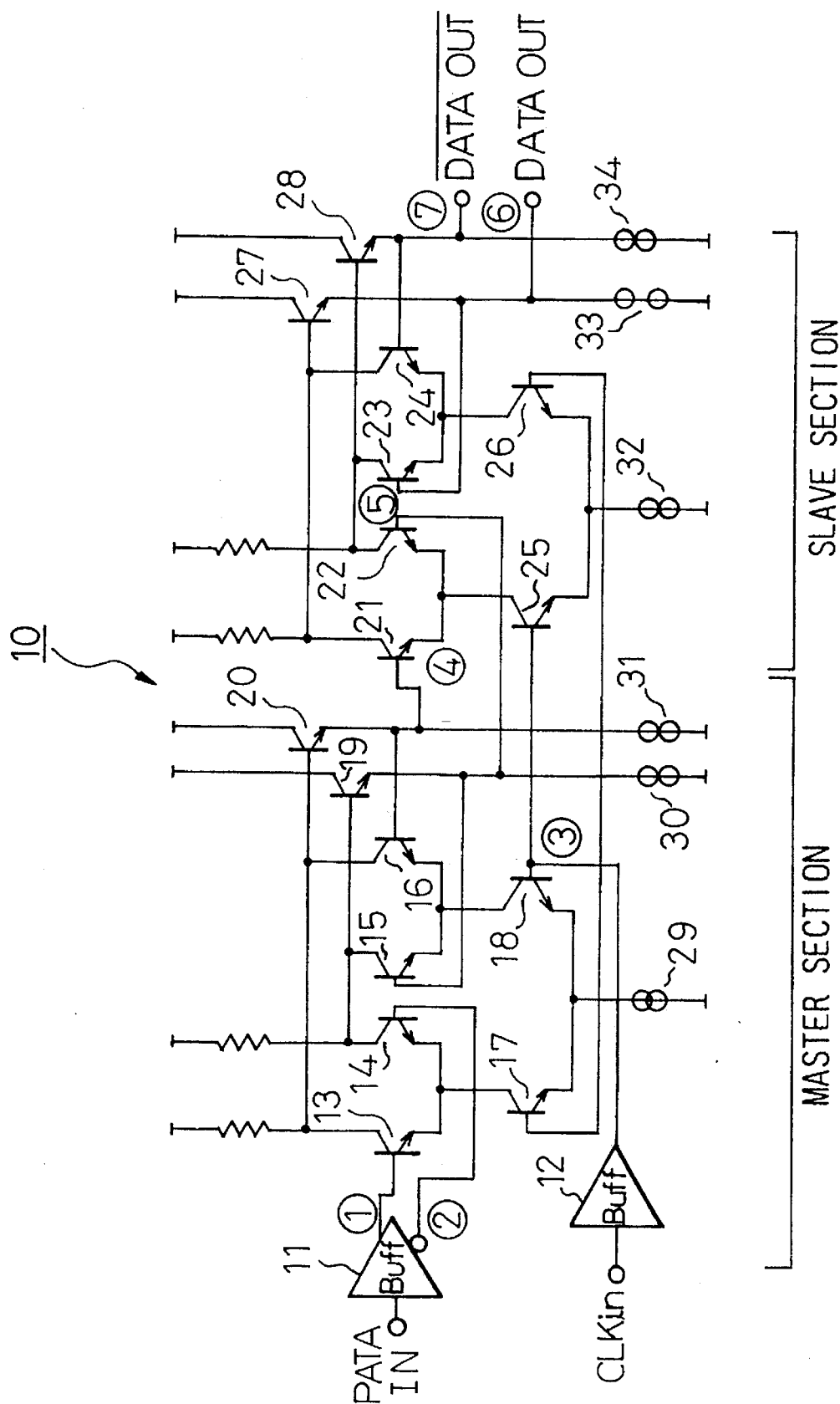
FIG. 7 shows a master-slave flip-flop circuit according to the present invention.

FIG. 7 shows a high-speed master-slave flip-flop circuit 10 of ECL (emitter-coupled logic) type employing the circuit for varying read timing according to the present invention.

Figure 8:
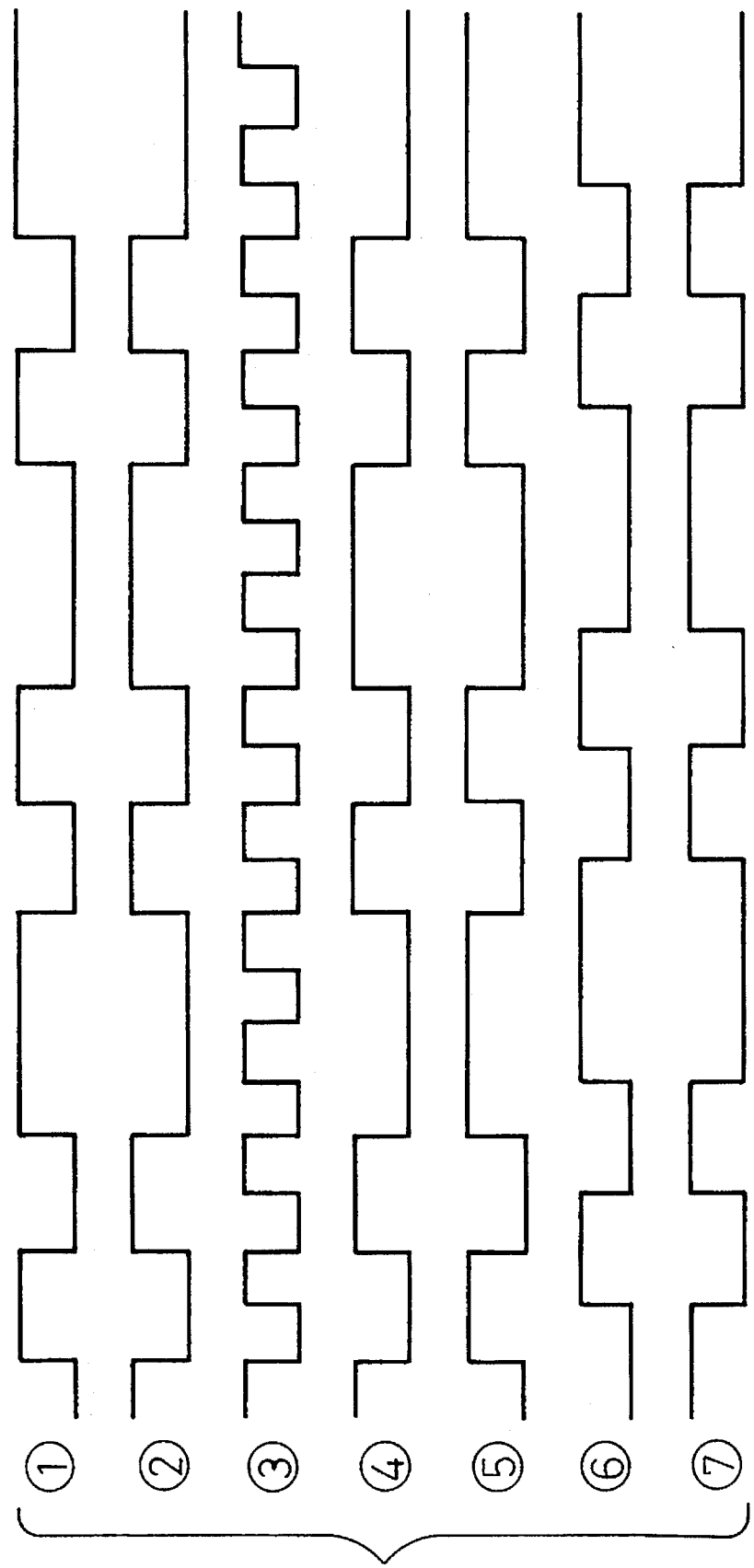
FIG. 8 explains the operation of the circuit of FIG. 7.

FIG. 8 explains the operation of the flip-flop circuit 10 of FIG. 7.

The upper part of the flip-flop circuit 10 corresponds to the logic circuit 1 of FIG. 2(A), and the lower part thereof corresponds to the comparator 2 of FIG. 2(A).

A master section of the flip-flop circuit 10 will be explained.

A first half cycle of a clock signal ③ in FIG. 8 is lower than a reference voltage Vref. Accordingly, transistor 17 of the pair of differential transistors 17 and 18 of the comparator 2 is ON, and transistor 18 is OFF. The pair of differential transistors 17 and 18 serve as a switch of a constant current source 29, which alternately drives the pair of differential transistors 13 and 14 and another pair of differential transistors 15 and 16. These transistors 13 to 16 form a latch circuit. When the transistor 17 is ON, the pair of differential transistors 13 and 14 are activated.

A differential output buffer 11 provides the transistor 13 with an input data signal ① and the transistor 14 with an inverted input data signal ②. Accordingly, the transistor 13 is turned ON, and the transistor 14 is turned OFF. The ON state of the transistor 13 turns OFF an output transistor 20 as indicated with ④ and turns ON the transistor 16. The OFF state of the transistor 14 turns ON an output transistor 19 as indicated with ⑤ and turns OFF the transistor 15. Accordingly, the output of the pair of differential transistors 13 and 14 and the output of the pair of differential transistors 15 and 16 provide the same logic value. In the next half cycle of high level of the clock signal ③, the first pair of differential transistors 13 and 14 are inactivated, and the second pair of differential transistors 15 and 16 are activated. At this time, the data in the first pair of differential transistors 13 and 14 is latched by the second pair of differential transistors 15 and 16.

A slave section of the flip-flop circuit 10 has the same structure as the master section. The slave section differs from the master section only in that it receives an inverted clock signal. The slave section receives the signals ⑤ and ④ from the output transistors 19 and 20 and operates a half cycle behind the master section, to provide signals ⑥ and ⑦.

Figure 9A:
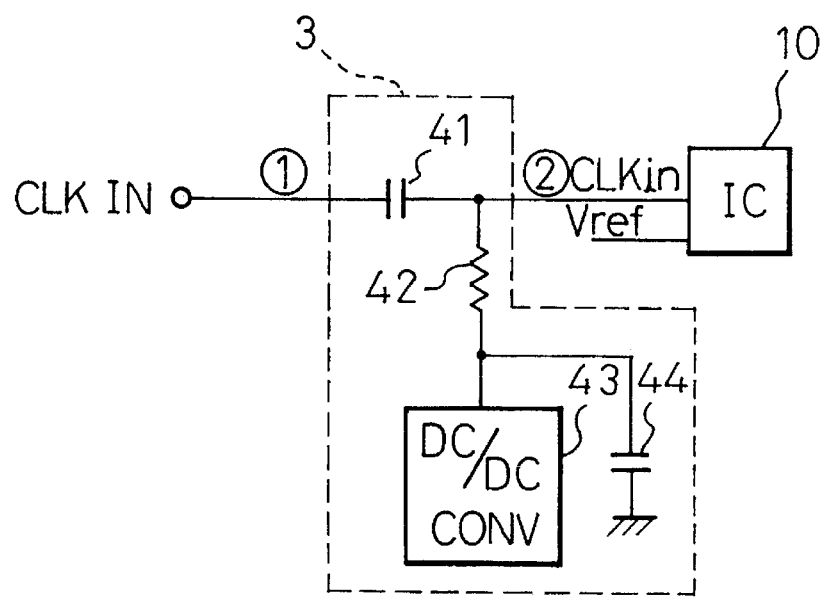
FIG. 9(A) shows a circuit for varying read timing according to a first embodiment of the present invention.
Figure 9B:
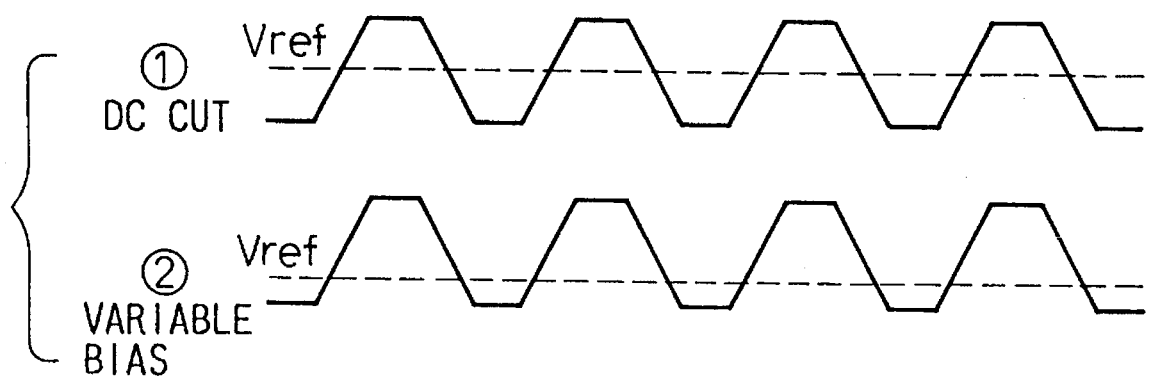
FIG. 9(B) explains the operation of the circuit of FIG. 9(A)

FIGS. 9(A) and 9(B) show an essential part of a circuit for varying read timing according to the first embodiment of the present invention.

The part shown in FIG. 9(A) corresponds to the bias changer 3 of FIG. 2(A). An IC 10 corresponds to the flip-flop circuit 10 of FIG. 7. FIG. 9(B) shows an input clock signal ① and an output clock signal ② of the bias changer 3.

A capacitor 41 of the bias changer 3 cuts DC components of the input clock signal ①. A DC-DC converter 43 and a resistor 42 apply new DC bias potential to the input clock signal. A capacitor 44 removes high-frequency noise. A comparator 2 in the IC 10 receives the clock signal ② and a reference voltage Vref. The DC-DC converter 43 applies DC bias potential to the clock signal ①, to change the time that of the clock signal ② crosses the reference voltage Vref. This results in changing the timing of the flip-flop circuit of latching a data signal. To apply a DC bias potential to the input clock signal ①, a DC power source such as a battery or a zener diode may be employed instead of the DC-DC converter 43.

Figure 10:
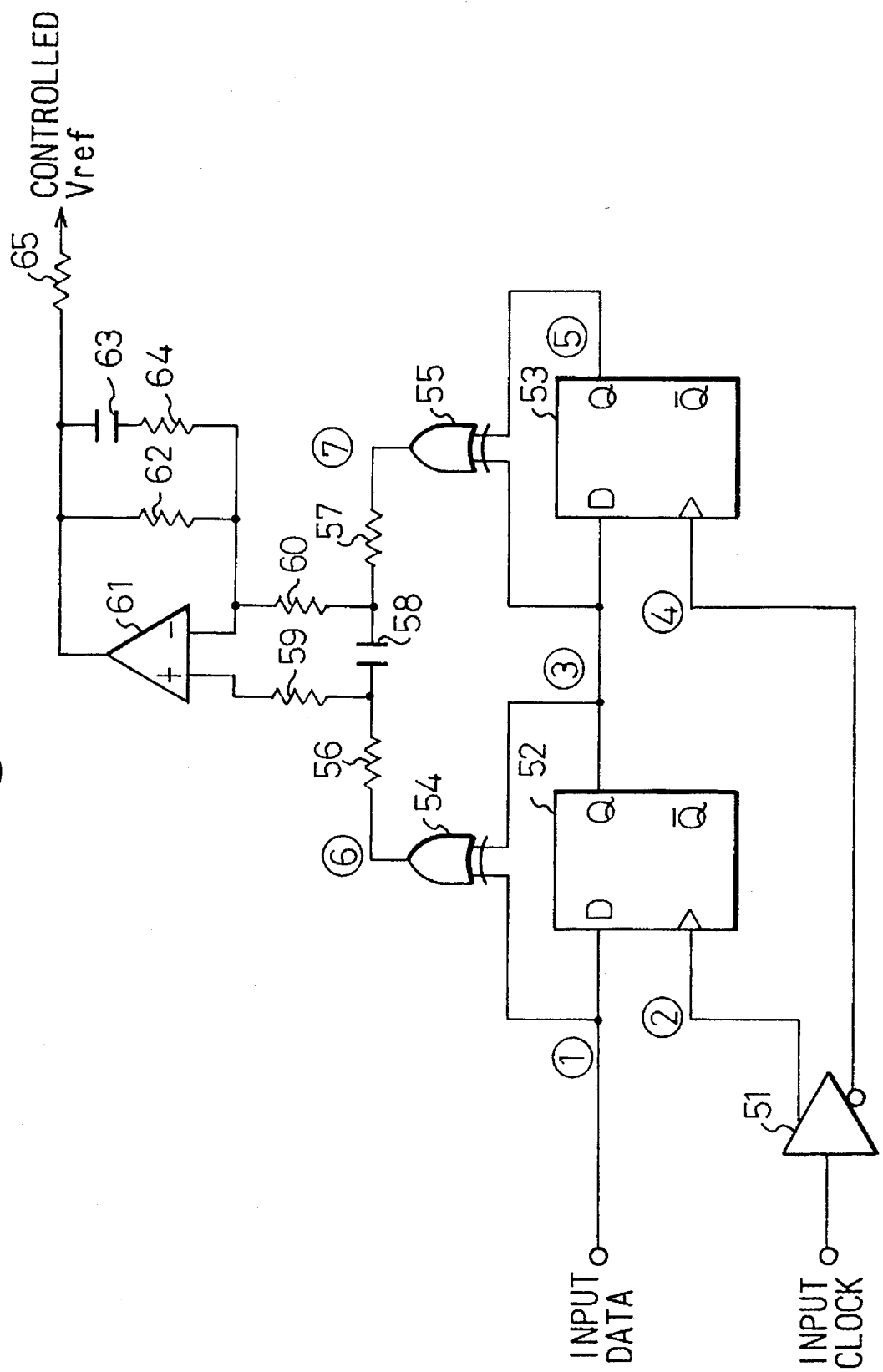
FIG. 10 shows a phase compensator of a circuit for varying read timing according to a second embodiment of the present invention.

FIG. 10 shows an essential part of a circuit for varying read timing according to the second embodiment of the present invention. The part shown in FIG. 10 corresponds to the reference voltage changer 4 of FIG. 2(B), or the phase compensator 6 of FIGS. 3(B) and 3(C).

Figure 11:
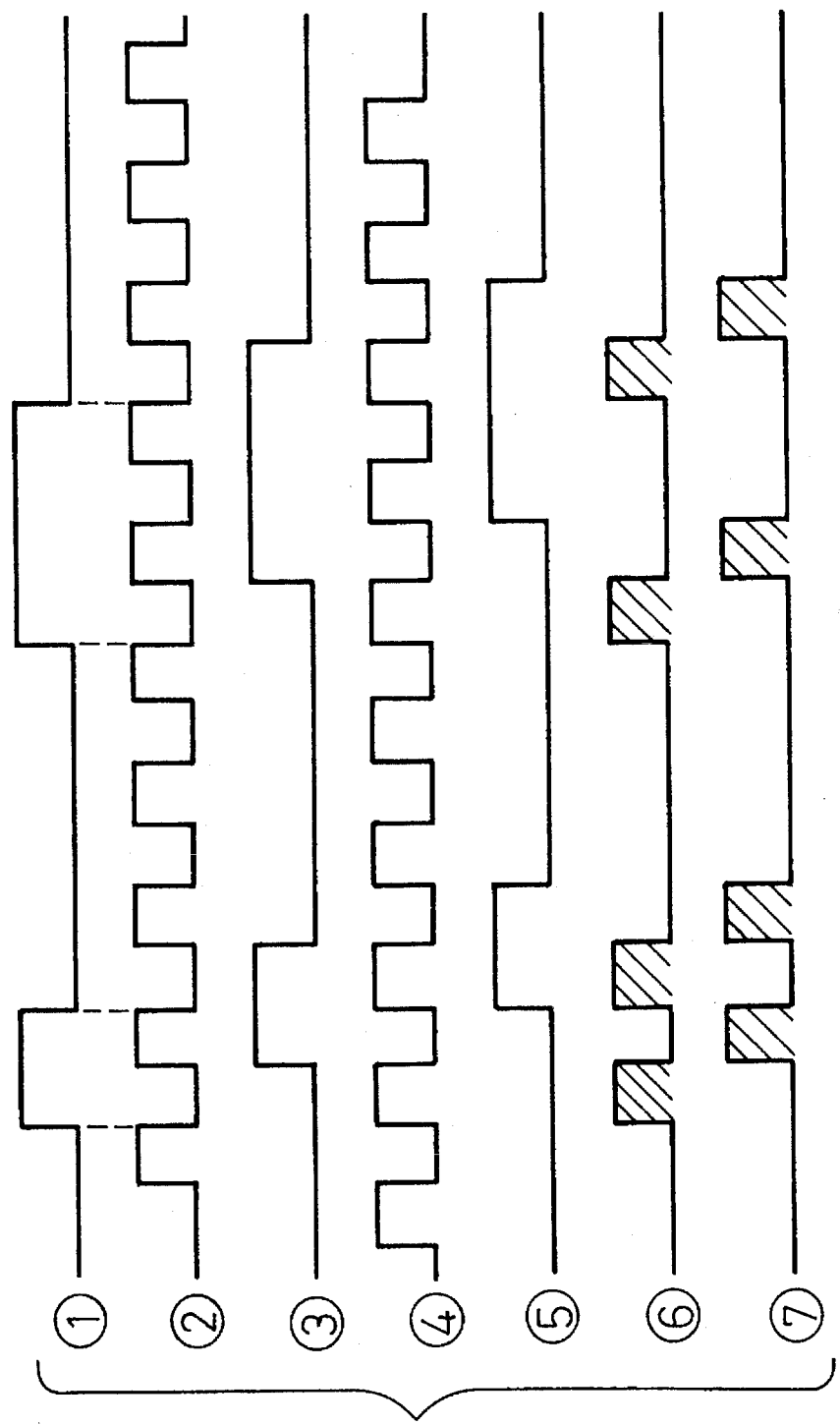
FIG. 11 explains the operation of the circuit of FIG. 10.

FIGS. 11, 12(A), and 12(B) explain the operation of the phase compensator 6 of FIG. 10.

A differential output buffer 51 provides a clock signal ②, and an inverted clock signal ④. In response to rising edges of the clock signals ② and ④, D-type flip-flop circuits 52 and 53 latch respective data signals. Input and output signals ① and ③ of the flip-flop circuit 52 are exclusively ORed by an EXOR circuit 54, which provides a differential pulse signal ⑥. Input and output signals ③ and ⑤ of the flip-flop circuit 53 are exclusively ORed by an EXOR circuit 55, which provides a differential pulse signal ⑦.

When the input data signal ① and clock signals ② and ④ are in phase as shown in FIG. 11, the waveforms of the differential pulse signals ⑥ and ⑦ from the EXOR circuits 54 and 55 agree with each other. As a result, charges of the same polarity and quantity are applied to each side of a capacitor 58, to cause no potential difference between the ends of the capacitor 58. Accordingly, a rectifier consisting of an operational amplifier 61 for detecting a voltage difference between the ends of the capacitor 58, resistors, and a capacitor, provides an output of zero. In this case, a reference voltage Vref to the comparator 2 is not adjusted.

In FIG. 12(A), the phases of the clock signals ② and ④ are ahead of the phase of the input data signal ①. In this case, the output ⑥ of the EXOR circuit 54 is larger than the output ⑦ of the EXOR circuit 55, which is unchanged from FIG. 11. As a result, the potential of the capacitor 58 on the EXOR circuit 54 side becomes higher than that on the EXOR circuit 55 side, to change the output of the rectifier to a positive side. Accordingly, the phase of the internal clock signal from the comparator 2 is delayed.

In FIG. 12(B), the phases of the clock signals ②, and ④ are behind the phase of the input data signal ②. In this case, the output ⑥ of the EXOR circuit 54 is smaller than the output ⑦ of the EXOR circuit 55, which is unchanged from FIG. 11. As a result, the potential on the capacitor 58 on the EXOR circuit 54 side becomes lower than that on the EXOR circuit 55 side, to change the output of the rectifier to a negative side. Accordingly, the phase of the internal clock signal from the comparator 2 is advanced.

Figure 13A:
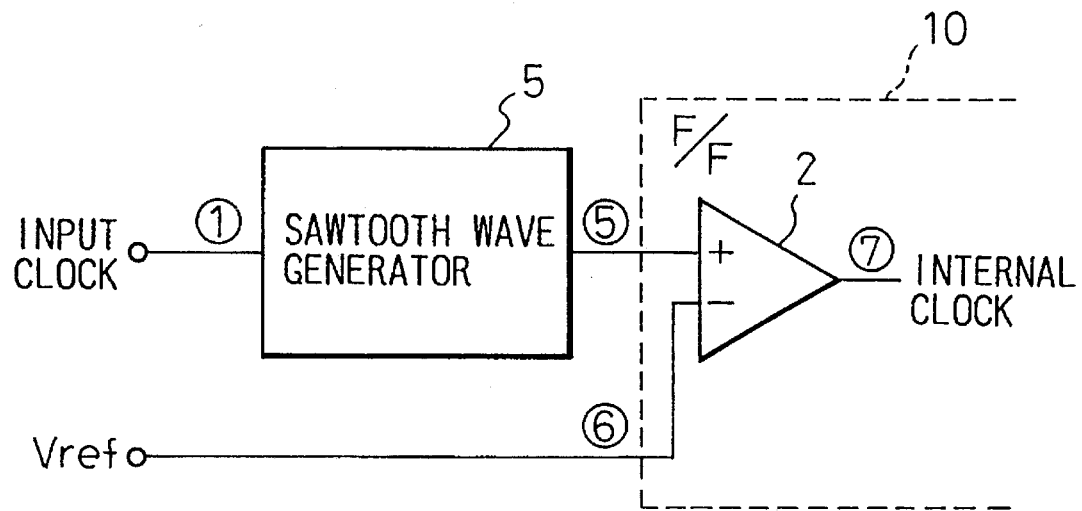
FIG. 13(A) shows a sawtooth-wave generator serving as the waveform converter of FIGS. 3(A) and 3(C)
Figure 13B:
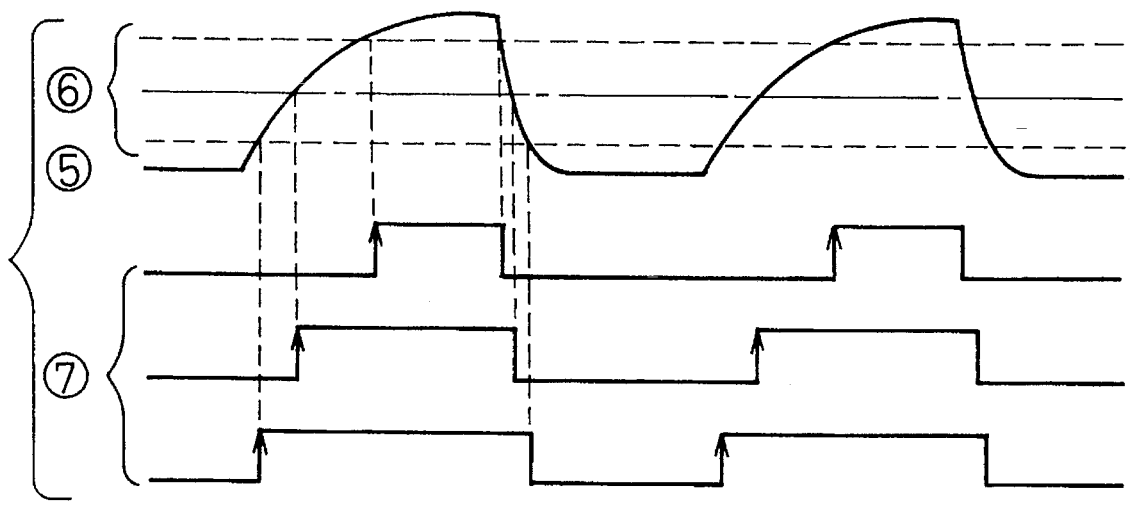
FIG. 13(B) explains the operation of the circuit of FIG. 13(A)
Figure 14:
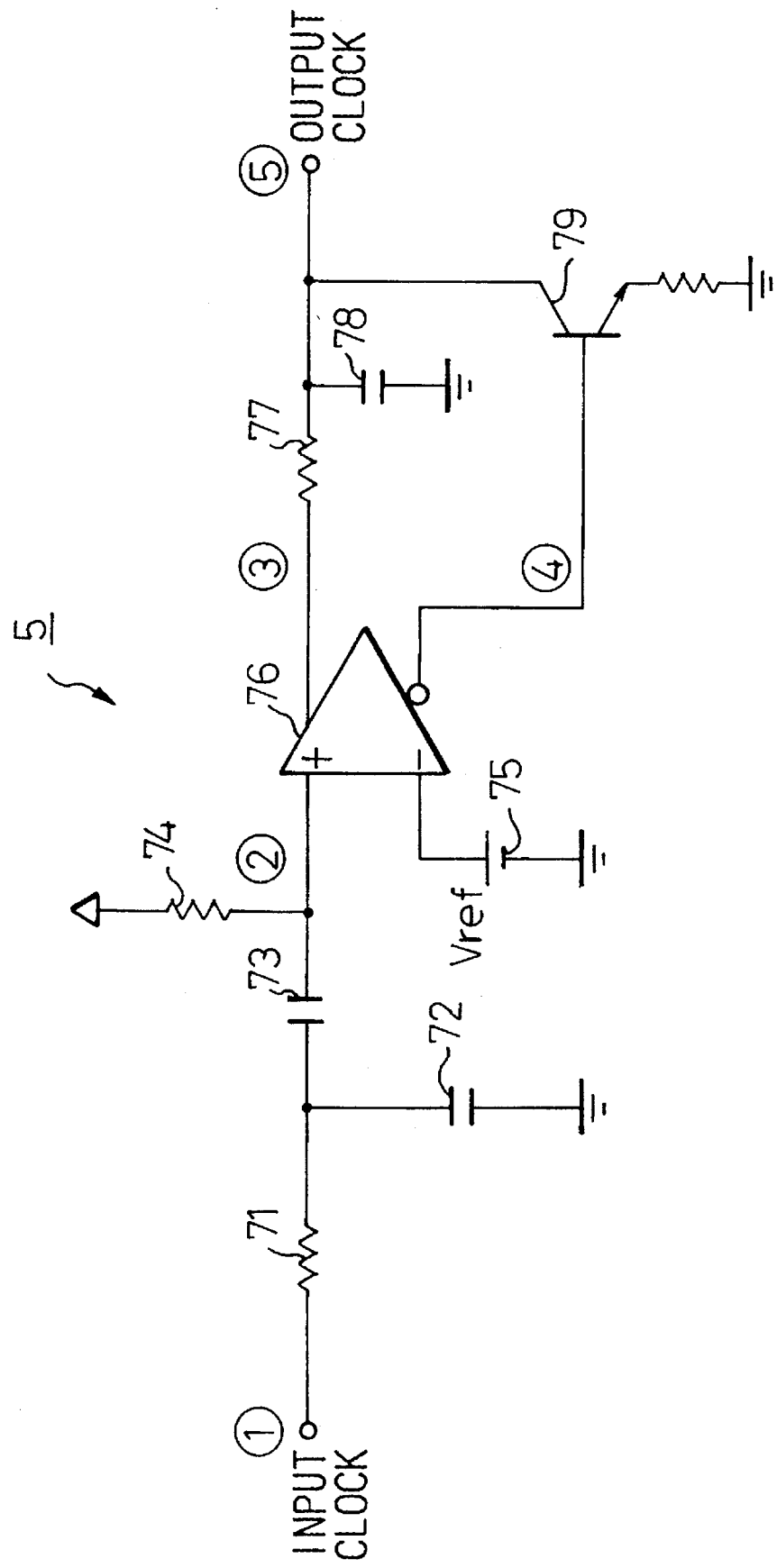
FIG. 14 shows an example of the sawtooth-wave generator of FIG. 13(A)

FIGS. 13(A) and 13(B) show a sawtooth-wave generator serving as the waveform converter 5 of FIGS. 3(A) and 3(C). FIG. 14 shows the details of the sawtooth-wave generator. FIG. 15 explains the operation of the sawtooth-wave generator of FIG. 14.

The sawtooth-wave generator 5 will be explained with reference to FIGS. 14 and 15.

Resistors 71 and 74 and capacitors 72 and 73 form a two-stage band-pass filter for converting an input clock signal ① into a sine wave signal ②. A comparator 76 compares the sine wave signal with a reference voltage provided by a constant voltage source 75 and provides differential outputs ③ and ④. When the differential output ③ is high, it charges an integrator formed of a resistor 77 and a capacitor 78, to form the gently rising part of a sawtooth wave ⑤. When the other differential output ④ is high, it turns ON a transistor 79, to instantaneously discharge the capacitor 78. This cause a steep fall in the sawtooth wave ⑤.

In FIG. 13(A), the sawtooth-wave generator 5 provides a sawtooth clock signal ⑤ to a clock input terminal of the flip-flop circuit 10 of FIG. 7.

In FIG. 13(B), the sawtooth clock signal ⑤ is used instead of a pulse clock signal. It is understood that even a small change in a reference voltage Vref ⑥ greatly changes the phase (the position of a rising edge) of an internal clock signal ⑦ provided by the comparator 2. In this way, the sawtooth clock signal is used to expand the range of the read timing.

Figure 16A:
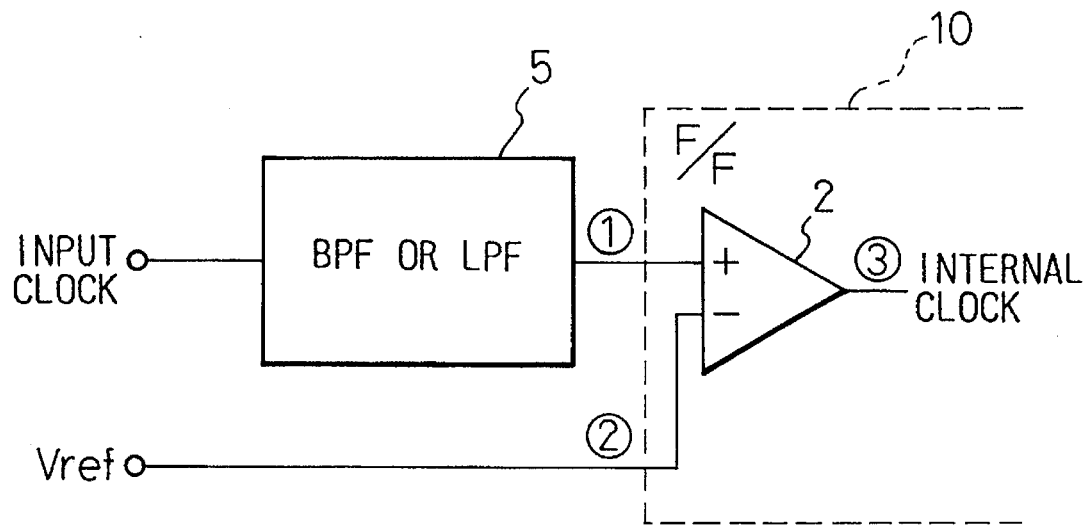
FIG. 16(A) shows a filter circuit serving as the waveform converter of FIGS. 3(A) and 3(C)
Figure 16B:
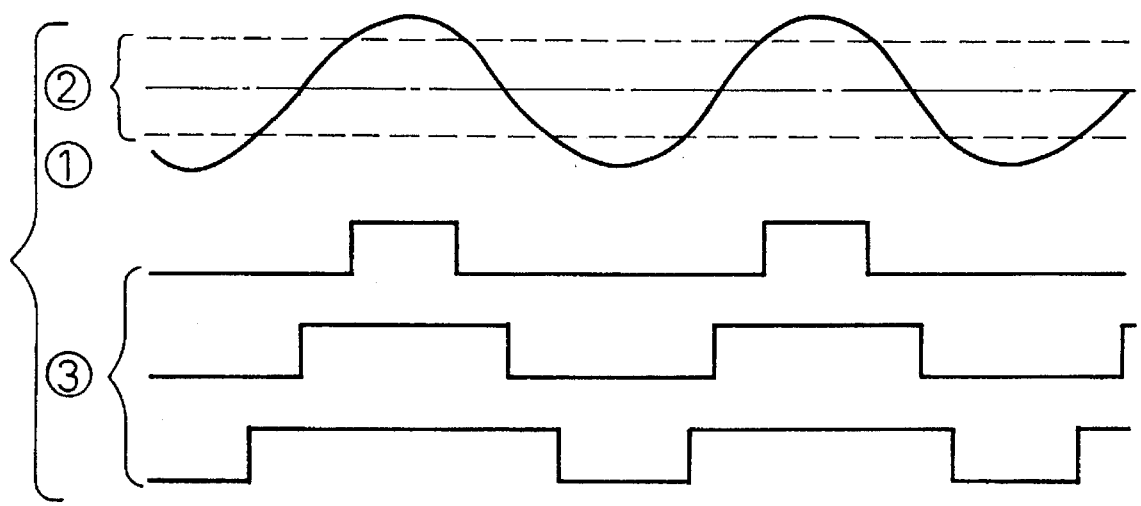
FIG. 16(B) explains the operation of the circuit of FIG. 16(A).

FIGS. 16(A) and 16(B) show a band-pass filter or a low-pass filter serving as the waveform converter 5 of FIGS. 3(A) and 3(C).

The function of the filter is substantially the same as the sawtooth-wave generator of FIGS. 13(A) and 13(B). The filter is additionally capable of changing the falling edge of a clock signal.

The band-pass filter may be formed of passive CR elements as shown in the first part of the circuit of FIG. 14, or it may be an active circuit having an operational amplifier. The low-pass filter can be realized in many forms.

Any one of the circuits for varying the read timing according to the present invention may serve as a data delay circuit if it is designed to change the phase of a data signal instead of a clock signal. The explanations above are also applicable to the data delay circuit.

As explained above, the present invention realizes a circuit for varying read timing by simply adding a part for varying DC bias potential or a reference voltage. Compared with the prior art, the circuit of the present invention is easy to install and inexpensive.

The present invention also realizes a waveform converter having a simple structure to cover a wide range of phases, as well as a phase compensator that automatically controls the phase of a clock signal by feed-forward control.

The present invention also realizes a data delay circuit of a simple structure.

What is claimed is:

1. A circuit for varying read timing, comprising:
   a comparator for comparing an external clock signal with a reference voltage that provides a logic decision level, and generating an internal clock signal;
   a logic circuit for fetching input data in synchronization with the internal clock signal; and
   a bias changer connected to the comparator, for varying DC bias potential applied to the external clock signal to the comparator, to change the phase of the internal clock signal.

2. The circuit according to claim 1, wherein the bias changer is a phase compensator for detecting a phase difference between the input data and the external clock signal and varying the DC bias potential accordingly.

3. The circuit according to claim 1, wherein the logic circuit is a flip-flop circuit for temporarily storing the input data in synchronization with the internal clock signal.

4. A circuit for varying read timing, comprising:
   a comparator for comparing an external clock signal with a reference voltage that provides a logic decision level, and generating an internal clock signal;
   a logic circuit for fetching input data in synchronization with the internal clock signal; and
   a reference voltage changer connected to the comparator, for varying the reference voltage to the comparator, to change the phase of the internal clock signal.

5. The circuit according to claim 4, wherein the reference voltage changer is a phase compensator for detecting a phase difference between the input data and the external clock signal and varying the reference voltage accordingly.

6. The circuit according to claim 4, further comprising a waveform converter connected to the comparator, for converting the waveform of the external clock signal to the comparator into a required waveform.

7. The circuit according to claim 6, wherein the waveform converter is a sawtooth-wave generator.

8. The circuit according to claim 6, wherein the waveform converter is a band-pass filter.

9. The circuit according to claim 4, wherein the logic circuit is a flip-flop circuit for temporarily storing the input data in synchronization with the internal clock signal.

10. A data delay circuit comprising:
    a reference voltage generator for generating a reference voltage corresponding to a delay between an input data signal and an output data signal; and
    a comparator for comparing the input data signal with the reference voltage to provide the output data signal with the delay.

11. The circuit according to claim 10, further comprising a waveform converter connected to the comparator, for converting the waveform of the input data signal to the comparator into a required waveform.

12. The circuit according to claim 11, wherein the waveform converter is a sawtooth-wave generator.

13. The circuit according to claim 11, wherein the waveform converter is a band-pass filter.

14. A data delay circuit comprising:
    a bias generator for applying DC bias potential, which corresponds to a delay between an input data signal and an output data signal, to the input data signal; and
    a comparator for comparing the biased data signal with a reference voltage that provides a logic decision level, and providing a data signal.

* * * * *